(12) United States Patent
Chitica et al.

(10) Patent No.: US 10,659,166 B2
(45) Date of Patent: May 19, 2020

(54) INTEGRATED OPTICAL TRANSCEIVER

(71) Applicant: Finisar Corporation, Sunnyvale, CA (US)

(72) Inventors: Nicolae Chitica, Kista (SE); Jürgen Hauenschild, Bochum (DE); Theron Jones, White Heath, IL (US); David Nidelius, Järfälla (SE); Lennart Lundqvist, Järfälla (SE); Elisabeth Källén, Stockholm (SE); Odd Steijer, Bromma (SE); Marek Chacinski, Farsta (SE); Åsa Johansson, Kungsängen (SE); Andrei Kaikkonen, Järfälla (SE)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 16/226,040

(22) Filed: Dec. 19, 2018

(65) Prior Publication Data

US 2019/0190608 A1 Jun. 20, 2019

Related U.S. Application Data

(60) Provisional application No. 62/608,094, filed on Dec. 20, 2017.

(51) Int. Cl.
*H04B 10/40* (2013.01)
*H01S 5/024* (2006.01)
(Continued)

(52) U.S. Cl.
CPC ........... *H04B 10/40* (2013.01); *G02B 6/4246* (2013.01); *G02B 6/4269* (2013.01);
(Continued)

(58) Field of Classification Search
None
See application file for complete search history.

(56) References Cited

U.S. PATENT DOCUMENTS

| 7,058,247 | B2* | 6/2006 | Crow | G02B 6/4232 |
| | | | | 385/14 |
| 8,692,276 | B2* | 4/2014 | Doany | G02B 6/4246 |
| | | | | 257/79 |

(Continued)

OTHER PUBLICATIONS

Gupta, Optoelectronic Devices and Systems, 2014, PHI Learning Pvt. Ltd., pp. 126-128 (Year: 2014).*

(Continued)

*Primary Examiner* — Jai M Lee
(74) *Attorney, Agent, or Firm* — Maschoff Brennan (57) ABSTRACT

An integrated optical transceiver, comprising
a laser component, comprising an array of VCSEL diodes formed on a laser diode substrate;
a laser driving component, comprising laser diode driving circuitry formed on a laser driving circuitry substrate;
a photodiode component, comprising an array of photodiodes formed on a photodiode substrate; and
a photodiode driving component, comprising photodiode driving circuitry formed on a photodiode driving circuitry substrate;
a first heat sink comprising a connected piece of material to transport excess heat away from the integrated optical transceiver and connected to both the laser and photodiode driving components; and
an electrically insulating material separating the photodiode substrate from the first heat sink and being air or dielectric material with a relative dielectric constant ε<10, wherein the electrically insulating material provides a gap having an effective electrical distance of at least 80 μm between the photodiode substrate and the first heat sink.

14 Claims, 7 Drawing Sheets

(51) Int. Cl.
  *H01S 5/42* (2006.01)
  *H04B 10/50* (2013.01)
  *H01S 5/068* (2006.01)
  *H01S 5/026* (2006.01)
  *H01S 5/022* (2006.01)
  *G02B 6/42* (2006.01)
  *H01S 5/062* (2006.01)

(52) U.S. Cl.
  CPC .......... *G02B 6/4273* (2013.01); *H01S 5/0261* (2013.01); *H01S 5/0262* (2013.01); *H01S 5/02248* (2013.01); *H01S 5/02438* (2013.01); *H01S 5/02446* (2013.01); *H01S 5/02469* (2013.01); *H01S 5/06817* (2013.01); *H01S 5/423* (2013.01); *H04B 10/503* (2013.01); *H01S 5/02296* (2013.01); *H01S 5/06226* (2013.01)

(56) References Cited

U.S. PATENT DOCUMENTS

| | | | | |
|---|---|---|---|---|
| 9,379,819 | B1* | 6/2016 | Mao | H04B 10/501 |
| 9,641,254 | B1 | 5/2017 | Shen et al. | |
| 2005/0058408 | A1* | 3/2005 | Colgan | G02B 6/4214 |
| | | | | 385/89 |
| 2005/0078720 | A1* | 4/2005 | Walker, Jr. | H01S 5/02288 |
| | | | | 372/36 |
| 2006/0244125 | A1* | 11/2006 | Shiomi | H01L 23/3735 |
| | | | | 257/706 |
| 2008/0095506 | A1 | 4/2008 | McColloch | |
| 2011/0044367 | A1* | 2/2011 | Budd | G02B 6/4201 |
| | | | | 372/50.21 |
| 2011/0044369 | A1* | 2/2011 | Andry | G02B 6/4204 |
| | | | | 372/50.124 |
| 2011/0089438 | A1* | 4/2011 | Steijer | H01L 24/81 |
| | | | | 257/82 |
| 2011/0206379 | A1* | 8/2011 | Budd | H04B 10/801 |
| | | | | 398/116 |
| 2012/0063718 | A1* | 3/2012 | Steijer | G02B 6/4201 |
| | | | | 385/14 |
| 2014/0264800 | A1* | 9/2014 | Gowda | H01L 23/4952 |
| | | | | 257/675 |
| 2017/0023751 | A1* | 1/2017 | Steijer | G02B 6/4246 |
| 2017/0264077 | A1* | 9/2017 | Chacinski | H01S 5/423 |
| 2019/0036618 | A1* | 1/2019 | Hasharoni | G02B 6/4279 |

OTHER PUBLICATIONS

ABL Heatsinks, Heatsink Design and Selection, 2015 (Year: 2015).*
Blazej, Danel, Thermal Interface Materials, 2003 (Year: 2003).*
OSI Optoelectronics, Application Notes, 2009 (Year: 2009).*
Princeton Optronics, Inc., Vertical-Cavity Surface-Emitting Laser Technology, 2010 (Year: 2010).*
Encyclopedia Britannica, Integrated Circuit (IC), 2015 (Year: 2015).*
Bergquist Company, Sil-Pad Design Guide, 2001 (Year: 2001).*
Search Report issued in EP Application No. 18214277.8 dated Apr. 24, 2019, 9pgs.

* cited by examiner

Fig. 8b though such a metal heat sink has a tendency to

INTEGRATED OPTICAL TRANSCEIVER

The present invention relates to an integrated optical transceiver, and in particular to a short range fiber optical transceiver. Typically, such an integrated optical transceiver is arranged for optical communication across distances of less than 1 km, across several, such as at least 12, preferably at least 16, communication channels and at bit rates per channel of at least 25 Gb/s.

In particular, the present invention relates to such integrated optical transceivers using an array of VCSEL (Vertical-Cavity Surface-Emitting Laser) diodes for light emission.

Such integrated optical transceivers typically also feature an array of photodiodes, arranged next to the VCSEL diodes across a substrate. Hence, light is both emitted and received in the same direction, perpendicularly to the substrate main plane.

A problem for such integrated optical transceivers is cooling of the transceiver. In order to cool the components adequately, it has been proposed to arrange a metal heat sink across the back side of the components of the integrated optical transceiver, via which excess heat can be transported away. However, such metal heat sink has a tendency to produce crosstalk between VCSEL diode driving circuitry and an amplifier component comprised in a photodiode driving circuitry. Typically, the current to the VCSEL is many times larger than the current from the said amplifier, why such crosstalk noise limits the performance of the integrated optical transceiver.

At the same time, temperature differences produce mechanical stress in such an integrated optical transceiver, which may lead to material deterioration or even breakage.

Hence, an integrated optical transceiver would be desirable that is both efficiently cooled, displays minimal crosstalk noise and which is mechanically stable.

The present invention solves the above described problems.

Hence, the invention relates to, in a first aspect, an integrated optical transceiver, comprising a laser component, in turn comprising an array of VCSEL (Vertical-Cavity Surface-Emitting Laser) diodes formed on a laser diode substrate; a laser driving component, in turn comprising laser diode driving circuitry formed on a laser driving circuitry substrate; a photodiode component, in turn comprising an array of photodiodes formed on a photodiode substrate; and a photodiode driving component, in turn comprising photodiode driving circuitry formed on a photodiode driving circuitry substrate; which optical transceiver further comprises a first heat sink in the form of a connected piece of material arranged to transport excess heat away from the integrated optical transceiver, which first heat sink is connected to both the laser driving component and the photodiode driving component; and an electrically insulating material separating the photodiode substrate from the first heat sink, which electrically insulating material is either air or a dielectric material with a relative dielectric constant ε<10, wherein the electrically insulating material provides a gap between the photodiode substrate and the first heat sink, the effective electrical distance of which gap is at least 80 μm.

In such an integrated optical transceiver, the laser diode substrate may be in direct contact with the first heat sink.

In such an integrated optical transceiver, the laser driving component and the photodiode driving component may arranged on one common flat non-conductive substrate.

In such an integrated optical transceiver, a ground plane may be attached to the common substrate, which ground plane also may comprise at least one opening surrounding the said photodiodes.

In such an integrated optical transceiver, said at least one opening may only comprise openings having a respective resonance frequency which is at least three times higher than a fundamental frequency of a crosstalk signal resulting from the laser driving component to the photodiode driving component.

In such an integrated optical transceiver, each individual photodiode may be surrounded by its own respective opening in the ground plane, which openings in turn may be separated by bridge parts of said ground plane.

In such an integrated optical transceiver, the photodiode component may be arranged with a lower height, perpendicularly to the flat substrate, than both the laser driving component and the photodiode driving component, hence forming the gap.

In such an integrated optical transceiver, the first heat sink may have a non-uniform thickness, in a direction perpendicular to said substrate, which thickness may be smaller in the vicinity of the photodiode component than in the vicinity of the laser driving component and the photodiode driving component, hence forming the gap.

In such an integrated optical transceiver, the first heat sink may comprise two discreet but connected layers, wherein a first one of said layers may extend across both the photodiode component, the laser driving component and the photodiode driving component, and wherein a second one of said layers, facing the photodiode component, may extend across the laser driving component and the photodiode driving component but not across the photodiode component.

In such an integrated optical transceiver, the photodiodes may be Positive Intrinsic Negative (PIN) photodiodes.

In such an integrated optical transceiver, a thermally conducting material may be arranged between, at a first side of the thermally conducting material, the laser component, the laser driving component and the photodiode driving component, and, at a second side of the thermally conducting material, the first heat sink, which thermally conducting material in turn may be arranged to absorb thermally induced mechanical movements between the first heat sink, the laser component, the laser driving component and the photodiode driving component.

In such an integrated optical transceiver, the thermally conducting material may be electrically conductive.

In such an integrated optical transceiver, the thermally conducting material may be a dielectric material, and the effective electrical thickness of the thermally conducting material may be at the most 10 μm.

In such an integrated optical transceiver, the thermally conducting material may have a hardness of 40-70, preferably 45-60, preferably about 50, on the Shore A scale.

In such an integrated optical transceiver, the first heat sink may be made of a metal material.

In such an integrated optical transceiver, an electrical signal being applied by the laser diode driving circuitry to the laser component may have a frequency of at least 100 MHz.

In a second aspect, the present invention relates to an integrated optical transceiver, comprising a laser component, in turn comprising an array of VCSEL (Vertical-Cavity Surface-Emitting Laser) diodes formed on a laser diode substrate; a laser driving component, in turn comprising laser diode driving circuitry formed on a laser driving circuitry substrate; a photodiode component, in turn comprising an array of photodiodes formed on a photodiode substrate; and a photodiode driving component, in turn comprising photodiode driving circuitry formed on a photodiode driving circuitry substrate; which optical transceiver further comprises a first heat sink in the form of a connected piece of semiconductor material arranged to transport excess heat away from the integrated optical transceiver, which first heat sink is connected to both the photodiode component, the laser driving component and the photodiode driving component, which semiconductor material has an electrical conductivity of between 0.1 and 15 Ohms·cm, preferably 1 and 15 Ohms·cm, preferably around 10 Ohms·cm.

In such an integrated optical transceiver, the laser diode substrate may be in direct contact with the first heat sink.

In such an integrated optical transceiver, the semiconductor material may have a thickness of at least 200 μm.

In such an integrated optical transceiver, the semiconductor material may be doped Si or SiC, or corresponding semiconductor material having a thermal conductivity of at least 100 W/(m·K).

In such an integrated optical transceiver, the laser driving component and the photodiode driving component may be arranged on one common flat non-conductive substrate.

In such an integrated optical transceiver, a ground plane may be attached to the common substrate, which ground plane comprises at least one opening surrounding the said photodiodes.

In such an integrated optical transceiver, said at least one opening only may comprise openings having a respective resonance frequency which is at least three times higher than a fundamental frequency of a crosstalk signal resulting from the laser driving component to the photodiode driving component.

In such an integrated optical transceiver, each individual photodiode may be surrounded by its own respective opening in the ground plane, which openings in turn may be separated by bridge parts of said ground plane.

In such an integrated optical transceiver, the integrated optical transceiver may further comprise a second heat sink, arranged at a side of the first heat sink facing away from the substrate, which first and second heat sinks in turn may be separated by a thermal gap pad material.

In such an integrated optical transceiver, the photodiodes may be Positive Intrinsic Negative (PIN) photodiodes.

In such an integrated optical transceiver, a thermally conducting material may be arranged between, at a first side of the thermally conducting material, the laser component, the laser driving component and the photodiode driving component, and, at a second side of the thermally conducting material, the first heat sink, which thermally conducting material in turn may be arranged to absorb thermally induced mechanical movements between the first heat sink, the laser component, the laser driving component and the photodiode driving component.

In such an integrated optical transceiver, the thermally conducting material may be electrically conductive.

In such an integrated optical transceiver, the thermally conducting material may be dielectric, and wherein the effective electrical thickness of which may be at least 50 μm, preferably at least 80 μm.

In such an integrated optical transceiver, the thermally conducting material may have a hardness of 40-70, preferably 45-60, preferably about 50, on the Shore A scale.

In such an integrated optical transceiver, the thermally conducting material may be arranged in direct contact with the laser component, the laser driving component, the photodiode component and the photodiode driving component.

In such an integrated optical transceiver, an electrical signal which is applied by the laser diode driving circuitry to the laser component, may have a frequency of at least 100 MHz.

In a third aspect, the present invention relates to an integrated optical transceiver, comprising a laser component, in turn comprising an array of VCSEL (Vertical-Cavity Surface-Emitting Laser) diodes formed on a laser diode substrate; a laser driving component, in turn comprising laser diode driving circuitry formed on a laser driving circuitry substrate; a photodiode component, in turn comprising an array of photodiodes formed on a photodiode substrate; and a photodiode driving component, in turn comprising photodiode driving circuitry formed on a photodiode driving circuitry substrate; which optical transceiver further comprises a first heat sink comprising a connected piece of magnetic absorbing material arranged to transport excess heat away from the integrated optical transceiver, which first heat sink is connected to both the photodiode component, the laser driving component and the photodiode driving component, which magnetic absorbing material is either magnetic microwave absorber material or lossy ferrite.

In such an integrated optical transceiver, the laser diode substrate may be in direct contact with the first heat sink.

In such an integrated optical transceiver, the magnetic absorbing material may have a thickness of at least 1000 μm.

In such an integrated optical transceiver, the magnetic absorbing material may have a relative magnetic permeability μ of at least 10 and a magnetic loss tangent tan δ of at least 0.1.

In such an integrated optical transceiver, the laser driving component and the photodiode driving component may be arranged on one common flat non-conductive substrate.

In such an integrated optical transceiver, a ground plane may be attached to the common substrate, which ground plane in turn may comprise at least one opening surrounding the said photodiodes.

In such an integrated optical transceiver, said at least one opening may only comprise openings in turn having a respective resonance frequency which is at least three times higher than a fundamental frequency of a crosstalk signal resulting from the laser driving component to the photodiode driving component.

In such an integrated optical transceiver, each individual photodiode may be surrounded by its own respective opening in the ground plane, which openings in turn may be separated by bridge parts of said ground plane.

In such an integrated optical transceiver, the integrated optical transceiver may further comprise a second heat sink, arranged at the side of the first heat sink facing away from the substrate, which first and second heat sinks in turn may be separated by a thermal gap pad material.

In such an integrated optical transceiver, the first heat sink may further comprise a layer of metal or dielectric material arranged at a side of the magnetic absorbing material facing away from the substrate.

In such an integrated optical transceiver, the photodiodes may be Positive Intrinsic Negative (PIN) photodiodes.

In such an integrated optical transceiver, a thermally conducting material may be arranged between, at a first side of the thermally conducting material, the laser component, the laser driving component and the photodiode driving component, and, at a second side of the thermally conducting material, the first heat sink, which thermally conducting material in turn may be arranged to absorb thermally induced mechanical movements between the first heat sink, the laser component, the laser driving component and the photodiode driving component.

In such an integrated optical transceiver, the thermally conducting material may be electrically conductive.

In such an integrated optical transceiver, the thermally conducting material may be dielectric, the effective electrical thickness of which may be at least 50 µm, preferably at least 80 µm.

In such an integrated optical transceiver, the thermally conducting material may have a hardness of 40-70, preferably 45-60, preferably about 50, on the Shore A scale.

In such an integrated optical transceiver, the thermally conducting material may be arranged in direct contact with the laser component, the laser driving component, the photodiode component and the photodiode driving component.

In such an integrated optical transceiver, a voltage electric signal applied by the laser diode driving circuitry to the laser component, may have a frequency of at least 100 MHz.

Finally, the invention also relates to an integrated optical circuit comprising an optical transceiver according to any one of the said first, second or third aspects.

In the following, the invention will be described in detail, with reference to exemplifying embodiments of the invention and to the enclosed drawings, wherein.

The Figures share reference numerals for same or corresponding parts, except for the first digit in each three digit reference numeral, that may differ between different aspects of the present invention as described herein. The FIGS. 1-6 are all schematic and simplified, and not drawn to scale.

Figure 1:
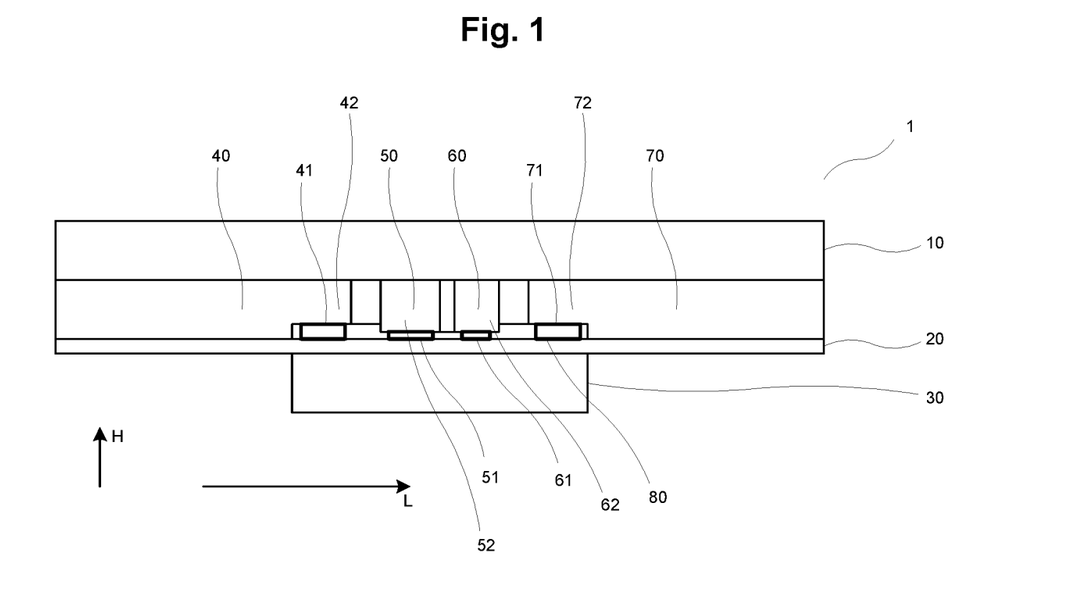
FIG. 1 illustrates an integrated optical transceiver not according to the present invention.

Hence, FIG. 1 illustrates an integrated optical transceiver 1 which is not according to the present invention, but which transceiver 1 is associated with a length direction L and a height direction H. A lateral direction H (see FIG. 3) is oriented perpendicularly to the paper. FIG. 1 does not show details that are conventional as such.

That the optical transceiver 1 is "integrated" means that it is made from one single material body, in the sense that it cannot be disassembled, and not in the sense that the material body is homogenous in its constitution. It may be produced using methods such as epitaxial growth and etching. The integrated optical transceiver 1 may exist and be used as an optical transceiver on an integrated circuit also comprising additional components. Typical fields of use include circuitry for short-range high-frequency optical communication, such as within a data centre.

The integrated optical transceiver 1 comprises a flat substrate layer 20, which comprises a ground plane; a laser component 60, in turn comprising an array of VCSEL (Vertical-Cavity Surface-Emitting Laser) diodes 61 formed on the laser diode substrate 62; a laser driving component 70, in turn comprising laser diode driving circuitry 71 formed on a laser driving circuitry substrate 72; a photodiode component 50, in turn comprising an array of photodiodes 51 formed on a photodiode substrate 52; and a photodiode driving component 40, in turn comprising photodiode driving circuitry 41 formed on a photodiode driving circuitry substrate 42. The photodiode driving circuitry 41 may comprise a TIA (Trans Impedance Amplifier, not shown).

The photodiodes 51 may be of any suitable type, such as Positive Intrinsic Negative (PIN) photodiodes.

The integrated optical transceiver 1 further comprises a glass material 30 covering the photodiodes 51 and the laser diodes 71. The glass material 30 may for instance be a borosilicate glass. Furthermore, the integrated optical transceiver 1 comprises an integrated circuit underfill material 80, between the substrate 20 and each of the diodes 41, 71 and the circuitry 41, 71. The underfill material 80 may for instance be an epoxy resin.

The integrated optical transceiver 1 further comprises heat sink 10, which is connected by direct physical attachment to the substrates 42, 52, 62, 72 and hence to the components 40, 50, 60, 70.

The photodiode driving circuitry substrate 42, and also the laser diode driving circuitry substrate 71, may be made from a semiconductor material such as Si, for instance having a dielectric constant ε of 11.9 and electric conductivity of 6.7 S/m. The photodiode substrate 52 may be made from a dielectric material having a high dielectric constant ε, such as having a dielectric constant ε=13.1, and with an electric conductivity of 1.8E-6 S/m. The laser diode substrate 62 may be made from a highly doped material (essentially being a metal material), such as having an electric conductivity of 5.0E4 S/m.

Thus, during operation, light enters the transceiver 1 in the height direction H from below in FIG. 1, through the glass material 30, is detected by the photodiodes 51 and corresponding electrical signals are processed by the photodiode driving circuitry 41, which in turn delivers electric signals corresponding to information carried by the received light to an electric port for further communication and/or data processing.

Correspondingly, the laser driving circuitry 71 receives electric signals from a suitable electric port, and feeds processed electric signals to the VCSEL laser diodes 61 which emits corresponding laser light. The emitted laser light exits the component through the glass 30 material.

The heat sink 10, which may for instance be a homogenous body of metal material, is arranged to remove excess heat from the component, and in particular from the laser diodes 51 and the driving circuitry 41, 71. However, the use of such a heat sink 10 also leads to significant crosstalk between the various components 41, 51, 61, 71.

In particular, the present inventors have discovered that such crosstalk arises from the laser diode driving circuitry 71 to the photodiodes 51, to such a level that signal detection becomes associated with much noise and is significantly affected in terms of accuracy and resulting data speeds.

Figure 2A:
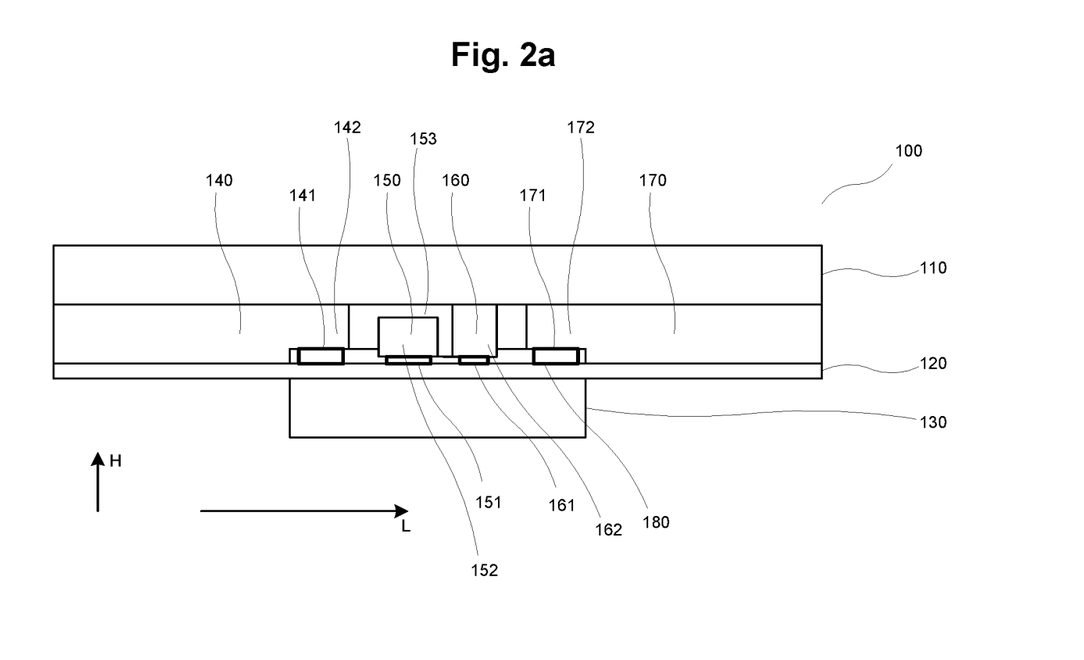
FIGS. 2a-2c illustrate an integrated optical transceiver according to a first aspect of the present invention.

FIG. 2a illustrates an integrated optical transceiver 100 according to a first aspect of the present invention. The integrated optical transceiver 100 is similar to the integrated optical transceiver 1 in many respects, and in particular all which has been said above regarding the integrated optical transceiver 1 is equally applicable to integrated optical transceiver 100, unless otherwise is stated. The same is true regarding the below described integrated optical transceivers 200 and 300.

The integrated optical transceiver 100 shares the same reference numerals, for identical or corresponding features, with the one shown in FIG. 1, but with a "1" before each respective reference numeral. The corresponding is also true regarding FIGS. 2b-6.

As illustrated in FIG. 2a, the integrated optical transceiver 100 also comprises a heat sink 110, a first heat sink, in the form of a connected piece of material arranged to transport excess heat away from the integrated optical transceiver 100, which first heat sink 100 is thermally connected to both the laser driving component 170 and the photodiode driving component 140. In particular, the first heat sink 100 may be connected to the respective substrate 142, 172 of the laser driving component 170 and the photodiode driving component 140, as illustrated in FIG. 2a on the side of each of said components 140, 170 facing away from the photodiodes 151 in the height direction H.

Furthermore, the integrated optical transceiver 100 comprises an electrically insulating material 153 separating the photodiode substrate 152 from the first heat sink 100 in the height direction H. In FIG. 2a, the insulating material 153 is air. However, the insulating material may alternatively be any dielectric material with a relative dielectric constant ε<10. Examples include the material Thermoset SC-324, marketed by the company Lord, Cary, USA.

According to this first aspect of the present invention, the electrically insulating material 153 provides an electric gap between the photodiode substrate 152 and the first heat sink 100, the effective electrical distance of which gap is at least 80 μm in the height direction H across the whole photodiode component 150, in particular providing such an electrical distance between the first heat sink 110 and the photodiode 151 anode and cathodes.

It has turned out that such a structure is capable of providing adequate cooling of the integrated optical transceiver 100, while at the same time limiting crosstalk noise to acceptable levels in many practical applications. In particular, crosstalk between the laser diodes 161 and the photodiodes 151 is limited. There are also other crosstalk paths producing noise when operating the transceiver 100, such as within and across the photodiode driving circuitry 141. However, the present inventors have discovered that the noise produced due to crosstalk between the laser diodes 161 and the photodiodes 151 is so dominating in most practical applications that limiting this noise source in the present way provides substantially improved operation noise characteristics.

According to an exemplifying embodiment, which is also shown in FIG. 2a, the laser component 160, and in particular the laser diode substrate 162, is in direct thermal contact with the first heat sink 110.

Hence, both the laser component 160, the laser driving component 170 and the photodiode driving component 140, and in particular the respective substrates 162, 172, 142 of said components, may be thermally connected to the first heat sink 100. Such thermal connection may be a direct physical connection, or alternatively an indirect physical connection via a thermally conductive material.

Figure 2B:
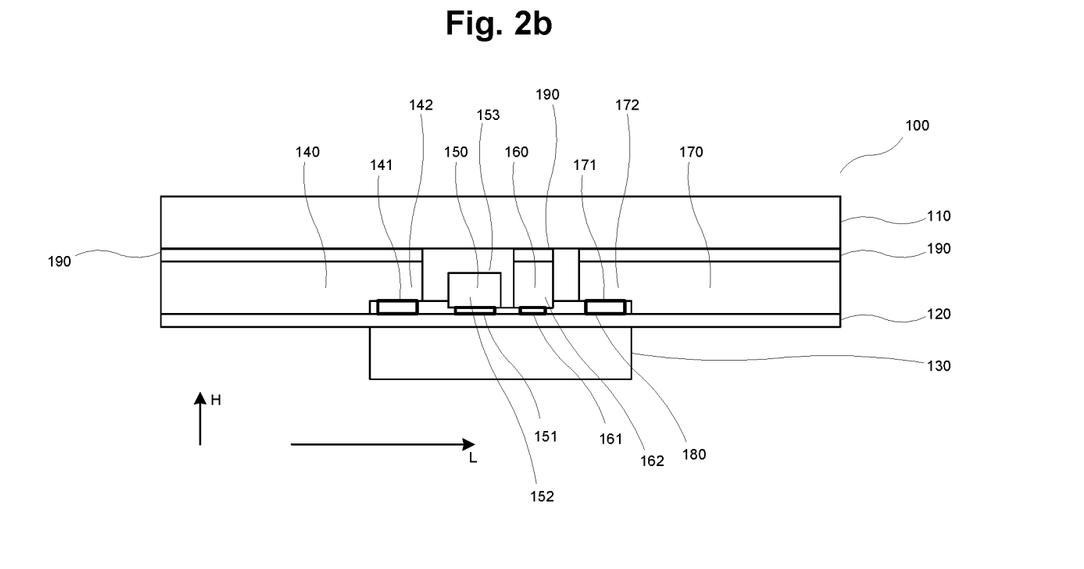

An example of the latter alternative is shown in FIG. 2b, wherein a thermally conducting material 190 is arranged between, at a first side (lower side in FIG. 2b) of the thermally conducting material 190, the laser component 160, the laser driving component 170 and the photodiode driving component 140, and, at a second side of the thermally conducting material 190 (upper side in FIG. 2b), the first heat sink 110.

The thermally conductive material 190 may also be electrically conductive. Preferably, the thermal conductivity of the material 190 is at least 2 W/(m·K). Furthermore, it is preferred that the electric conductivity of the material 190 is at least 1 S/m. Examples of suitable materials include materials made of mixtures of nickel and dielectric materials.

In the configuration illustrated in FIG. 2b, the thermally conducting material 190 is further arranged to absorb thermally induced mechanical movements between the first heat sink 110, the laser component 160, the laser driving component 170 and the photodiode driving component 140.

To achieve this, the thermally conducting material 190 may have a hardness of 40-70, preferably 45-60, preferably about 50, on the Shore A scale.

In a particularly preferred example, the thermally conducting material 190 is a dielectric material, with an effective electrical thickness of the thermally conducting material 190, in the height direction H, of at the most 10 μm. The relative dielectric constant ε of the thermally conducting material 190 may be around 4. For many applications, 2.5 ε of the material should be less than the electrical distance in the height direction H for the thermally conducting material 190.

The thermally conducting material 190 may be arranged only to cover, in the longitudinal L and lateral W directions, the photodiode driving component 140, the photodiode component 150 and the laser driving component 170, as is illustrated in FIG. 2b. In particular, it is not arranged to cover or thermally or directly contact the laser component 160.

The use of such a thermally conductive material 190 separating the components 140, 160, 170 from the first heat sink 110, sufficient cooling can be achieved with low crosstalk while still achieving a very robust, mechanically stable and temperature gradient resisting structure.

Figure 2C:
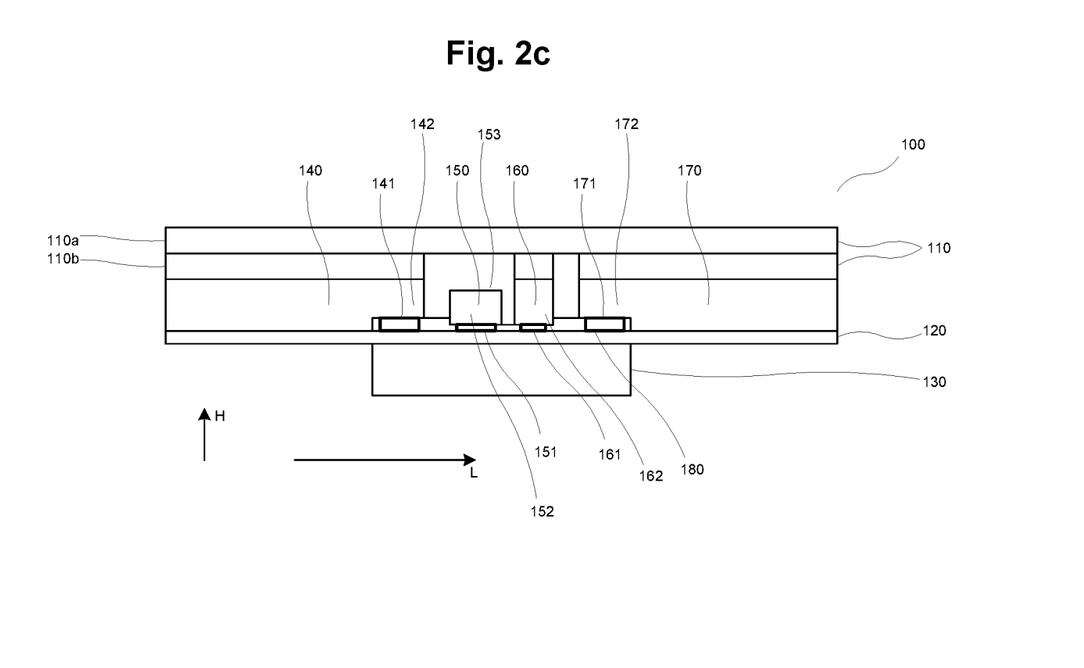
Figure 3:
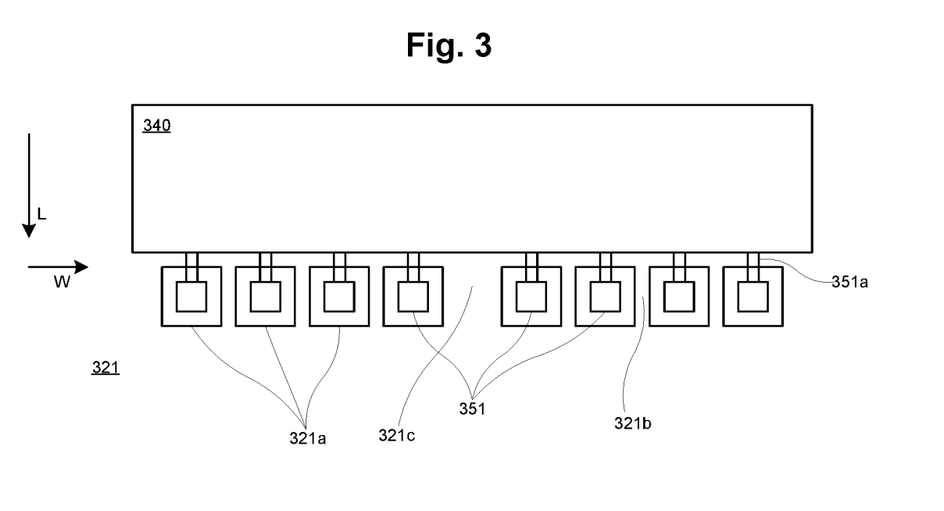
FIG. 3 is a detail view of an integrated optical transceiver according to the present invention.

As illustrated in FIGS. 2a-2c, the laser driving component 170 and the photodiode driving component 140 are both arranged on one common flat non-conductive substrate 120. In this case, a ground plane 321, which not shown in FIGS. 2a-2c, but is illustrated in FIG. 3, is attached to the common substrate, which ground plane 321 comprises at least one through opening 321a surrounding the photodiodes 351. The photodiodes 351 are connected to the photodiode driving component 340, and in particular to the photodiode driving circuitry, using conductors 351a.

In FIG. 3, a lateral width direction W of the integrated optical transceiver is also shown, together with the above discussed longitudinal direction L.

According to one embodiment, said at least one opening 321a in the ground plane only comprises such one or several openings 321a each having a respective resonance frequency which is at least three times higher than a fundamental frequency of a crosstalk signal resulting from the laser driving component to the photodiode component and/or photodiode driving component 340.

In particular, and as illustrated in FIG. 3, each individual photodiode 31 may be surrounded by its own respective opening 321a in the ground plane 321, which openings 321a are then separated by respective bridge parts 321b, 321c of said ground plane 321. The openings 321a may be arranged in clusters of a few (such as between 4 and 8) openings with relatively narrow bridge parts 321b, which clusters are then separated by relatively broad bridge parts 321c. It is noted that the word "relatively" here relates to a comparison of respective widths (in the lateral direction W) of different bridge parts 321b, 321c.

A similar ground plane 321 arrangement, with individual through openings 321a in which each photodiode 351 is accommodated, is described in EP 2775806 B1, to which reference is made regarding further details.

The present inventors have discovered that the use of such ground plane 321 configuration is particularly advantageous together with a thermal relief arrangement according to the first, second or third aspects of the present invention as described herein. Hence, particularly good noise behaviours have been detected when such thermal relief strategies are coupled with such ground plane 321 configurations. In particular, this is true in the presently described case wherein most of the crosstalk noise originate between the laser diode and the photodiode.

Hence, it is understood that the ground plane 321 configuration illustrated in FIG. 3 can be combined with any and all of the embodiments described herein of the present invention.

Now returning to FIG. 2a, it is noted that the photodiode component 150 is arranged with a lower height, perpendicularly to the flat substrate 120 in the height direction H, than both the laser driving component 170 and the photodiode driving component 140, hence forming the above described electric gap. Starting off from a conventional integrated optical transceiver and looking to modify its configuration so as to implement the present invention, it is realized that this can equally well be done by lowering the height of the photodiode component 150 and/or by raising the height of the laser diode component 160. In the latter case, the height of the photodiode driving component 140 and/or the laser diode driving component 170 may then also be raised.

Turning to FIG. 2c, an alternative or supplementary embodiment is illustrated, in which the first heat sink 110 has a non-uniform thickness, in a direction perpendicular to said substrate 120 (the height direction H). The said thickness is smaller in the vicinity of the photodiode component 150 than in the vicinity of the laser driving component 170 and the photodiode driving component 140, and preferably also in the vicinity of the laser component 160, hence forming the above discussed gap. In other words, the said thickness is smaller across, (in the longitudinal direction L) the photodiode component 150 than across the photodiode driving component 140, the photodiode component 150 and the laser driving component 170.

In particular, FIG. 2c illustrates the first heat sink 110 comprising two discreet but connected layers 110a, 110b, wherein a first one 110a of said layers extends across both the photodiode component 150, the laser driving component 170 and the photodiode driving component 140, and preferably also across the laser component 160. Furthermore, a second one 110b of said layers, facing the photodiode component 150, extends across the laser driving component 170 and the photodiode driving component 140, and preferably also across the laser component 160, but not across the photodiode component 150, hence forming said gap. This provides a construction which is easy to manufacture with predictable product quality. The layers 110a, 110b may be attached to each other in any suitable conventional manner. They may also be part of the same connected and integrated material body, such as a single body of aluminium, where the interruptions of layer 110b are formed as indentations or recesses from below in said single body.

Further particularly, it is preferred that the first heat sink 110, and as the case may be the first 110a and second 110b layer, are made of a metal material, such as a highly doped semiconductor material or a metal or metal alloy, such as aluminium.

It is realized that the differing heights of the components 140, 150, 160, 170 as illustrated in FIG. 2a may be combined with the differing thickness of the heat sink 110 as illustrated in FIG. 2c, so that both principles can be used in the same transceiver 100. It is also realized that the thermal material 190 illustrated in FIG. 2b can also be used in the structure shown in FIG. 2c.

Figure 4:
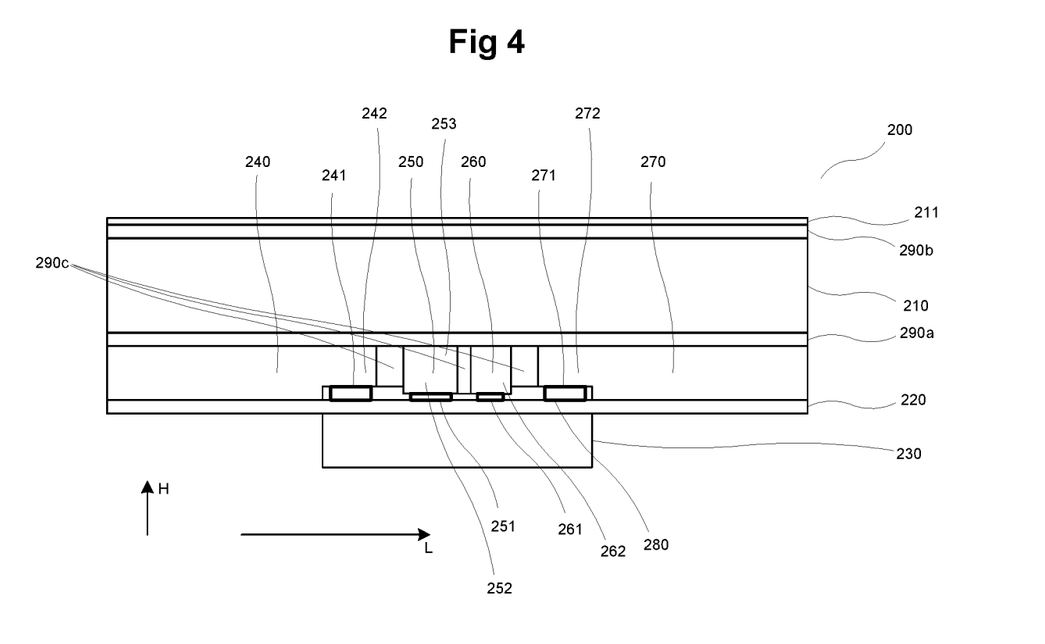
FIG. 4 illustrates an integrated optical transceiver according to a second aspect of the present invention.

FIG. 4 illustrates an integrated optical transceiver 200 according to a second aspect of the present invention. For both this second aspect, as well as the third aspect described below, all which has been said above regarding transceivers 1 and 100 is applicable to relevant parts.

The integrated optical transceiver 200, like the transceiver 100, comprises a laser component 260, in turn comprising an array of VCSEL diodes 261 formed on a laser diode substrate 262; a laser driving component 270, in turn comprising laser diode driving circuitry 271 formed on a laser driving circuitry substrate 272; a photodiode component 250, in turn comprising an array of photodiodes 251 formed on a photodiode substrate 252; and a photodiode driving component 240, in turn comprising photodiode driving circuitry 241 formed on a photodiode driving circuitry substrate 242. Materials for these components may be same as for transceiver 100, discussed above.

The integrated optical transceiver 200 further comprises a first heat sink 210, arranged to transport excess heat away from the integrated optical transceiver 200.

However, in contrast to the first heat sink 110 of transceiver 100, the first heat sink 210 of transceiver 200 comprises, such as is constituted by, a connected piece of semiconductor material, which is connected to both the photodiode component 250, the laser driving component 270 and the photodiode driving component 240, and preferably also to the laser component 260.

That the first heat sink 210 is "connected" to these components 240, 250, 260, 270 means that it is thermally connected to the components 240, 250, 260, 270 in question, in a way which may be similar to the above-discussed thermal connection of the first heat sink 110 to the components 140, 150, 160, 170. Hence, the thermal connection in question may be a direct physical connection, or alternatively an indirect physical connection via a thermally conductive material.

According to this second aspect of the invention, the semiconductor material of the first heat sink 210 has an electrical conductivity of between 0.1 and 15 Ohms·cm, preferably 1 and 15 Ohms·cm, preferably around 10 Ohms·cm. Specifically, if the semiconductor material of the first heat sink 210 is too little doped, it becomes dielectric, resulting in resonance problems. If it is too highly doped, it becomes a metal, resulting in increased crosstalk.

Suitable semiconductor materials include doped Si and SiC, or corresponding semiconductor materials, with high thermal conductivity, such as at least 100 W/(m·K). For instance, the semiconductor material may be doped Si with thermal conductivity 370 W/(m·K) or doped SiC with thermal conductivity of at least 150 W/(m·K). The mentioned electrical conductivity, of about 10 Ohm·cm, provides significant loss and hence mitigates crosstalk noise. Suitable materials are optimized for high mechanical stability and high thermal conductivity, while observing said limits for electric conductivity.

As is the case for the transceiver 100, it is preferred that also the laser diode component 260, and in particular the laser diode substrate 262, is in direct contact, such as in direct thermal contact, with the first heat sink 210.

The semiconductor material of the first heat sink 210 may have a thickness of at least 200 μm, such as at least 400 μm, and may also have a thickness of at the most 1000 μm. Preferably, the thickness is about 500 μm.

Furthermore, the integrated optical transceiver 200 may comprise a second heat sink 211, arranged at a side of the first heat sink 210 facing away, in the height direction H, from the common planar substrate 220. The first 210 and second 211 heat sinks may be separated by a second layer of thermal gap pad material 290b. The second heat sink 211 may be manufactured from similar materials as the first heat sink 110 of the transceiver 100, such as aluminium.

Similarly to the thermally conducting material 190 of the transceiver 100, the transceiver 200 may also comprise a first thermally conducting material 290a, arranged between, at a first side of the first thermally conducting material 290a, the laser component 260, the laser driving component 270 and the photodiode driving component 240, and preferably also the photodiode component 250, and, at a second side of the first thermally conducting material 290a, the first heat sink 210. This first thermally conducting material 290a may, similarly, be arranged to absorb thermally induced mechanical movements between the first heat sink 210, the laser component 260, the laser driving component 270 and the photodiode driving component 240.

As is the case for the thermally conductive material 108, the first thermally conductive material may be electrically conductive. Alternatively, the first thermally conducting material 290a is a dielectric material, the effective electrical thickness of which may be at least 50 μm, preferably at least 80 μm.

In order to be able to absorb mechanical stress, the first thermally conducting material 290a has a hardness of 40-70, preferably 45-60, preferably about 50, on the Shore A scale, similarly to the thermally conductive material 190.

Moreover, the first thermally conducting material 290a may be arranged in direct contact with the laser component 260, the laser driving component 270, the photodiode component 250 and the photodiode driving component 240.

The relative dielectric constant E of the thermally conducting material 290a may be around 4. For many applications, 2.5 ε of the material should be less than the electrical distance in the height direction H for the thermally conducting material 290. The same applies also to the thermally conducting material 390a (see below).

The second thermally conducting material 290b layer may be of similar material constitution as the first thermally conducting material 290a. A similar thermally conducting material 290c may also be used to fill the void between the components 240, 250, 260, 270.

Such a constitution according to this second aspect of the present invention provides similar advantages as that of the first aspect of the present invention.

Figure 5A:
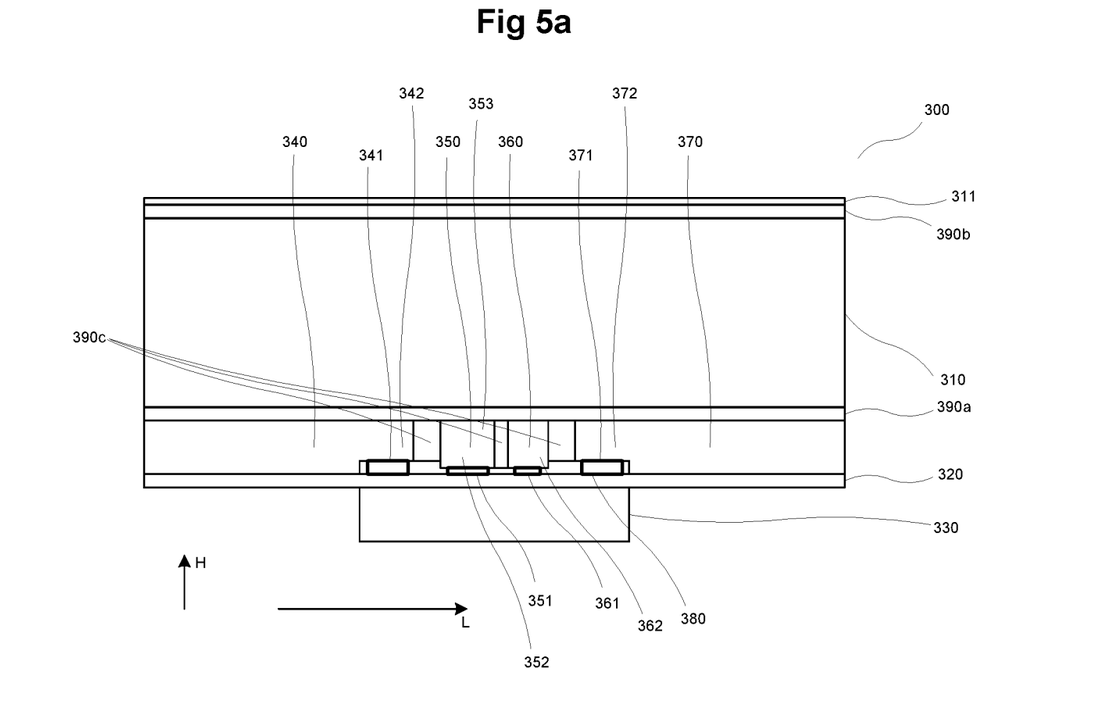
FIGS. 5a and 5b illustrate an integrated optical transceiver according to a third aspect of the present invention.

FIG. 5a illustrates an integrated optical transceiver 300 according to a third aspect of the present invention, comprising a laser component 360, in turn comprising an array of VCSEL diodes 361 formed on a laser diode substrate 362; a laser driving component 370, in turn comprising laser diode driving circuitry 371 formed on a laser driving circuitry substrate 372; a photodiode component 350, in turn comprising an array of photodiodes 351 formed on a photodiode substrate 352; and a photodiode driving component 340, in turn comprising photodiode driving circuitry 341 formed on a photodiode driving circuitry substrate 342.

The integrated optical transceiver 300 further comprises a first heat sink 310, in turn comprising, preferably consisting of, a connected piece of magnetic absorbing material arranged to transport excess heat away from the integrated optical transceiver 300.

The first heat sink 310 is connected to both the photodiode component 350, the laser driving component 370 and the photodiode driving component 340, and preferably also to the laser component 360. Here, "connected to" has the same interpretation as given above for the first heat sinks 110, 210.

According to this third aspect of the present invention, the magnetic absorbing material of the first heat sink 310 is either magnetic microwave absorber material or lossy ferrite.

As is the case for the laser diode substrate 262 and the first heat sink 210, the laser diode substrate 362 may be in direct contact with the first heat sink 310.

In order to provide sufficient crosstalk minimization, the magnetic absorbing material 310 may have a thickness of at least 1000 μm, preferably at least 1500 μm. Preferably, the magnetic absorbing material 310 has a thickness of at the most 3000 μm. The magnetic absorbing material 310 may have a thickness of about 2000 μm.

Furthermore, the magnetic absorbing material 310 may have a relative magnetic permeability μ of at least 10 and a magnetic loss tangent tan $\delta_e$ of at least 0.1, such as about 0.5.

As is the case with the transceiver 200, the integrated optical transceiver 300 may further comprise a second heat sink 311, arranged at the side of the first heat sink 310, in the height direction H, facing away from the substrate 320, which first 310 and second 311 heat sinks are separated by a second thermal gap pad material 390b. The second heat sink 311 may be manufactured from similar materials as the first heat sink 110 of the transceiver 100, such as aluminium.

The integrated optical transceiver 300 furthermore comprises a first thermally conducting material 390a, arranged between, at a first side of the first thermally conducting material 390a, the laser component 360, the laser driving component 370 and the photodiode driving component 340, and preferably also the photodiode component 350, and, at a second side of the first thermally conducting material 390a, the first heat sink 310, which thermally conducting material is arranged to absorb thermally induced mechanical movements between the first heat sink 310, the laser component 360, the laser driving component 370 and the photodiode driving component 340.

Hence, the first thermally conducting material 390a may be similar to the thermally conducting material 290a of transceiver 200. As such, it may be electrically conductive or dielectric with an effective electrical thickness of which is at least 50 μm, preferably at least 80 m. It also may have a hardness of 40-70, preferably 45-60, preferably about 50, on the Shore A scale. The first thermally conducting material 390a may also be arranged in direct contact with the laser component 260, the laser driving component 270, the photodiode component 250 and the photodiode driving component 240.

The second thermally conducting material 390b may be arranged, in the height direction H, between the first heat sink 310 and the second heat sink 311, in a way similar to the second thermally conducting material 290b. Also, a similar thermally conducting material 390c may be arranged to fill the void between the components 340, 350, 360, 370.

Figure 5B:
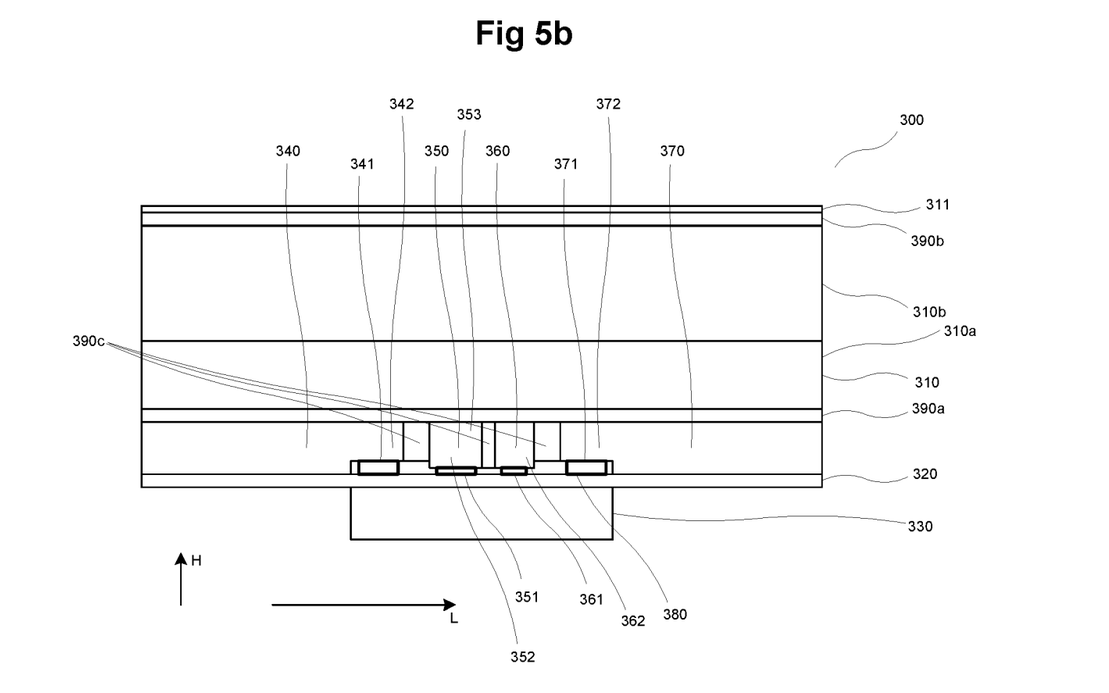

FIG. 5b illustrates an alternative embodiment of the third aspect of the present invention, in which the first heat sink 310 further comprises a lower (in the height direction H) layer 310a of the above discussed magnetic absorber material, as well as an upper layer 310b of metal or dielectric material arranged at a side of the magnetic absorbing material facing away from the substrate 320 in the height direction H.

Hence, in this case the first heat sink 310 consists of a sandwich material comprising the medium thermally conductive magnetic absorber material 310a and high thermal conductivity (metal or dielectric) material 310b. The high thermal conductivity material 310b may for instance be aluminium or CVD diamond.

In case when the magnetic absorber material 310a is sufficiently elastic to accommodate for mechanical tolerances and thermal expansion, the first thermal gap material 390a may be substituted partially or fully by the magnetic absorber material 310a. This is possible in both embodiments shown in FIGS. 5a and 5b.

This third aspect of the present invention also provides similar advantages as the first and second aspects described above.

The present inventors have discovered that these solutions are most efficient in applications in which a voltage electric signal applied by the laser diode driving circuitry 171, 271, 371 to the laser component 160, 260, 360 has a frequency of at least 100 MHz.

Figure 6:
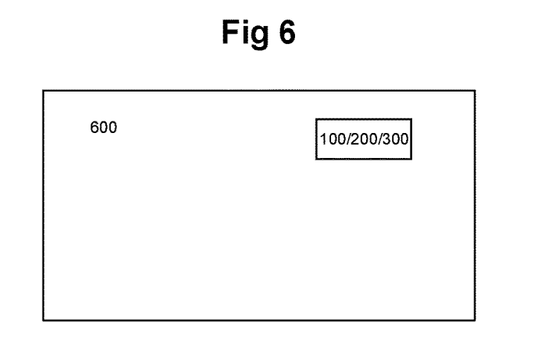
FIG. 6 illustrates an integrated optical circuit according to the present invention.

The present invention further relates to an integrated optical circuit 600 comprising an optical transceiver 100, 200, 300 according to the first, second or third aspects of the invention. Such a circuit 600 is illustrated in FIG. 6.

Figure 7A:
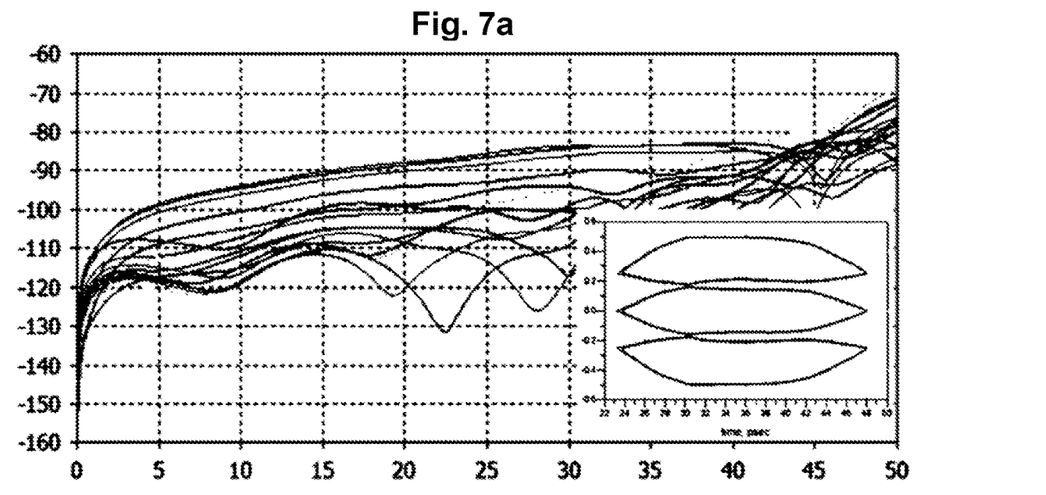
FIGS. 7a-7c illustrate simulated performance parameters for an integrated optical transceiver according to the first, second and third aspects, respectively.
Figure 7B:
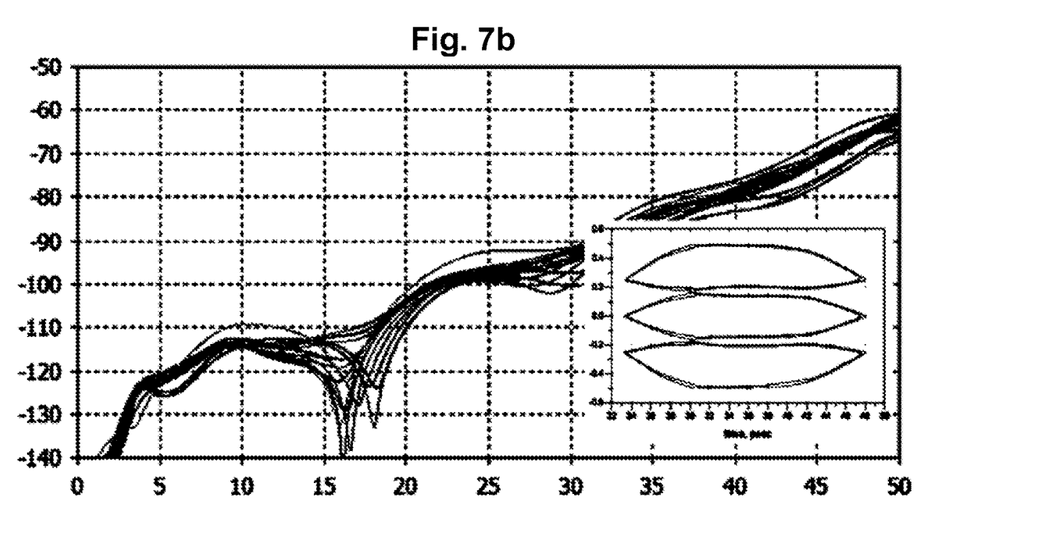
Figure 7C:
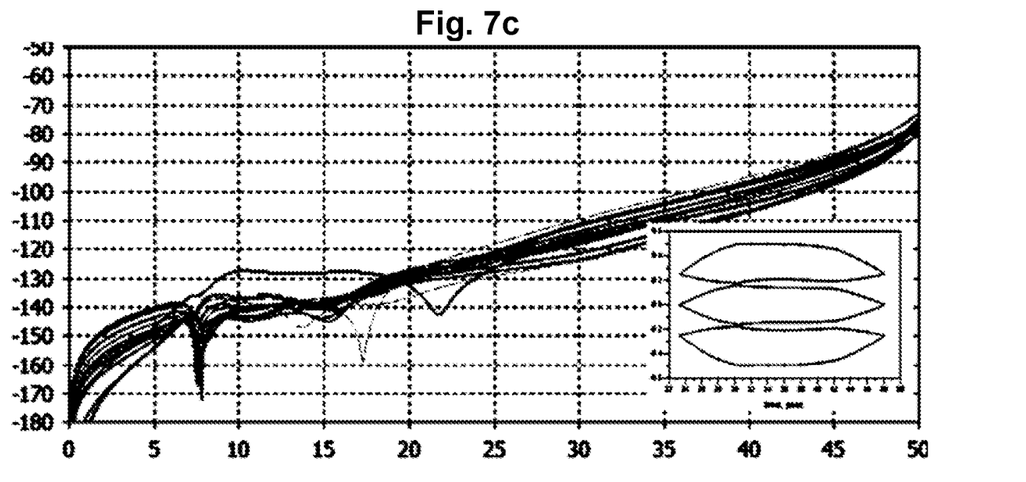

FIGS. 7a, 7b and 7c are respective charts depicting crosstalk magnitudes for detailed simulations run in relation to a respective model of an integrated optical circuits according to the first, second and third aspect of the present invention. Each chart shows principal Tx-Rx coupling s-parameters (electric connection across various paths between transmitter and receiver part, in dB (Y axis) to frequency in GHz (X axis)) in 16 channel module. Also, in each chart an eye diagram BER=1.E-12 contour is shown for 56 Gbps PAM4 signal at Rx IC input at typical operating conditions. Inner and outer contours correspond to the case with and without crosstalk, respectively. As is clear from each of these charts, inner and outer contours coincide, corresponding to no observed crosstalk.

Figure 8A:
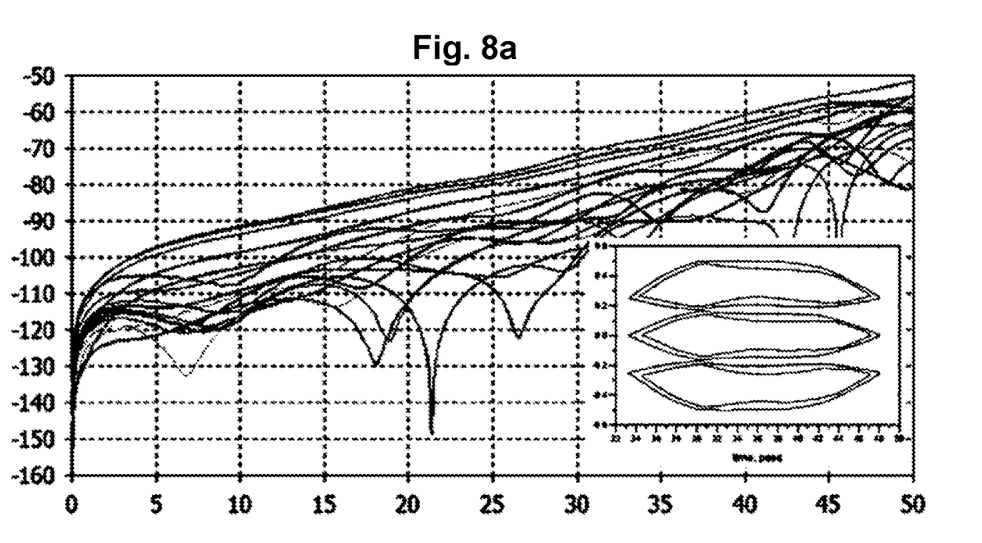
FIGS. 8a and 8b illustrate simulated performance parameters for a respective integrated optical transceiver not according to the present invention.
Figure 8B:
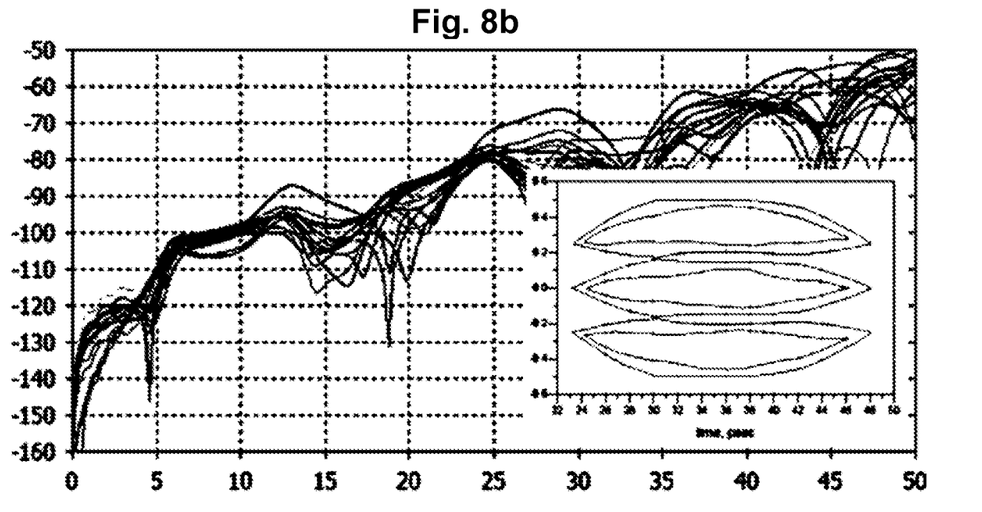

As a comparison, FIGS. 8a and 8b illustrate the corresponding charts for two different configurations not according to the invention; in FIG. 8a, both the laser component and the photodiode component are directly attached to one and the same metal heat sink, while in FIG. 8b, the same configuration is used but with a thin thermoset gap material between the components and the heat sink. As is clear from FIGS. 8a and 8b, inner eye diagram contours are smaller than outer contours, corresponding to significant electric crosstalk.

In one aspect of the invention, it relates to an integrated optical transceiver, comprising
 a laser component, in turn comprising an array of VCSEL (Vertical-Cavity Surface-Emitting Laser) diodes formed on a laser diode substrate;
 a laser driving component, in turn comprising laser diode driving circuitry formed on a laser driving circuitry substrate;
 a photodiode component, in turn comprising an array of photodiodes formed on a photodiode substrate; and
 a photodiode driving component, in turn comprising photodiode driving circuitry formed on a photodiode driving circuitry substrate;
which optical transceiver further comprises
 a first heat sink in the form of a connected piece of semiconductor material arranged to transport excess heat away from the integrated optical transceiver, which first heat sink is connected to the photodiode component, the laser driving component and the photodiode driving component, which semiconductor material has an electrical conductivity of between 0.1 and 15 Ohms·cm, preferably 1 and 15 Ohms·cm, preferably around 10 Ohms·cm.

In some embodiments the laser diode substrate is in direct contact with the first heat sink.

In some embodiments the semiconductor material has a thickness of at least 200 µm.

In some embodiments the semiconductor material is doped Si or SiC, or corresponding semiconductor material having a thermal conductivity of at least 100 W/(m·K).

In some embodiments the laser driving component and the photodiode driving component are arranged on one common flat non-conductive substrate.

In some embodiments a ground plane is attached to the common substrate, which ground plane comprises at least one opening surrounding the said photodiodes.

In some embodiments said at least one opening only comprises openings having a respective resonance frequency which is at least three times higher than a fundamental frequency of a crosstalk signal resulting from the laser driving component to the photodiode driving component.

In some embodiments each individual photodiode is surrounded by its own respective opening in the ground plane, which openings are separated by bridge parts of said ground plane.

In some embodiments the integrated optical transceiver further comprises a second heat sink, arranged at a side of the first heat sink facing away from the substrate, which first and second heat sinks are separated by a thermal gap pad material.

In some embodiments the photodiodes are Positive Intrinsic Negative (PIN) photodiodes.

In some embodiments a thermally conducting material is arranged between, at a first side of the thermally conducting material, the laser component, the laser driving component and the photodiode driving component, and, at a second side of the thermally conducting material, the first heat sink, which thermally conducting material is arranged to absorb thermally induced mechanical movements between the first heat sink, the laser component, the laser driving component and the photodiode driving component.

In some embodiments the thermally conducting material is electrically conductive.

In some embodiments the thermally conducting material is dielectric, and the effective electrical thickness of which is at least 50 µm, preferably at least 80 µm.

In some embodiments the thermally conducting material has a hardness of 40-70, preferably 45-60, preferably about 50, on the Shore A scale.

In some embodiments the thermally conducting material is arranged in direct contact with the laser component, the laser driving component, the photodiode component and the photodiode driving component.

In some embodiments an electrical signal applied by the laser diode driving circuitry to the laser component, has a frequency of at least 100 MHz.

In another aspect of the invention, it relates to an integrated optical transceiver, comprising a laser component, in turn comprising an array of VCSEL (Vertical-Cavity Surface-Emitting Laser) diodes formed on a laser diode substrate;

a laser driving component, in turn comprising laser diode driving circuitry formed on a laser driving circuitry substrate;

a photodiode component, in turn comprising an array of photodiodes formed on a photodiode substrate; and a photodiode driving component, in turn comprising photodiode driving circuitry formed on a photodiode driving circuitry substrate;

which optical transceiver further comprises a first heat sink comprising a connected piece of magnetic absorbing material arranged to transport excess heat away from the integrated optical transceiver, which first heat sink is connected to the photodiode component, the laser driving component and the photodiode driving component, which magnetic absorbing material is either magnetic microwave absorber material or lossy ferrite.

In some embodiments the laser diode substrate is in direct contact with the first heat sink.

In some embodiments the magnetic absorbing material has a thickness of at least 1000 μm.

In some embodiments the magnetic absorbing material has a relative magnetic permeability μ of at least 10 and a magnetic loss tangent tan $δ_e$ of at least 0.1.

In some embodiments the laser driving component and the photodiode driving component are arranged on one common flat non-conductive substrate.

In some embodiments a ground plane is attached to the common substrate, which ground plane comprises at least one opening surrounding the said photodiodes.

In some embodiments said at least one opening only comprises openings having a respective resonance frequency which is at least three times higher than a fundamental frequency of a crosstalk signal resulting from the laser driving component to the photodiode driving component.

In some embodiments each individual photodiode is surrounded by its own respective opening in the ground plane, which openings are separated by bridge parts of said ground plane.

In some embodiments the integrated optical transceiver further comprises a second heat sink, arranged at the side of the first heat sink facing away from the substrate, which first and second heat sinks are separated by a thermal gap pad material.

In some embodiments the first heat sink further comprises a layer of metal or dielectric material arranged at a side of the magnetic absorbing material facing away from the substrate.

In some embodiments the photodiodes are Positive Intrinsic Negative (PIN) photodiodes.

In some embodiments a thermally conducting material is arranged between, at a first side of the thermally conducting material, the laser component, the laser driving component and the photodiode driving component, and, at a second side of the thermally conducting material, the first heat sink, which thermally conducting material is arranged to absorb thermally induced mechanical movements between the first heat sink, the laser component, the laser driving component and the photodiode driving component.

In some embodiments the thermally conducting material is electrically conductive.

In some embodiments the thermally conducting material is dielectric, and wherein the effective electrical thickness of which is at least 50 μm, preferably at least 80 μm.

In some embodiments the thermally conducting material has a hardness of 40-70, preferably 45-60, preferably about 50, on the Shore A scale.

In some embodiments the thermally conducting material is arranged in direct contact with the laser component, the laser driving component, the photodiode component and the photodiode driving component.

In some embodiments a voltage electric signal applied by the laser diode driving circuitry to the laser component, has a frequency of at least 100 MHz.

The invention also relates to an integrated optical circuit comprising an optical transceiver of any one of the above described types.

Above, preferred embodiments have been described. However, it is apparent to the skilled person that many modifications can be made to the disclosed embodiments without departing from the basic idea of the invention.

For instance, the integrated optical transceivers described herein may comprise additional layers and features, apart from the ones described. The corresponding is true regarding the integrated optical circuit according to the invention. For instance, the above described first and second heat sinks may transport the heat away using for instance forced air convection, such as by using a conventional fan.

Hence, the invention is not limited to the described embodiments, but can be varied within the scope of the enclosed claims.

What is claimed is:

1. An integrated optical transceiver, comprising
a laser component, in turn comprising an array of VCSEL (Vertical-Cavity Surface-Emitting Laser) diodes formed on a laser diode substrate;

a laser driving component, in turn comprising laser diode driving circuitry formed on a laser driving circuitry substrate;

a photodiode component, in turn comprising an array of photodiodes formed on a photodiode substrate; and a photodiode driving component, in turn comprising photodiode driving circuitry formed on a photodiode driving circuitry substrate;

wherein the integrated optical transceiver further comprises:

a first heat sink in a form of a connected piece of material arranged to transport excess heat away from the integrated optical transceiver, wherein the first heat sink is connected to both the laser driving component and the photodiode driving component; and an electrically insulating material separating the photodiode substrate from the first heat sink, wherein the electrically insulating material is either air or a dielectric material with a relative dielectric constant ε<10, wherein the electrically insulating material provides a gap between the photodiode substrate and the first heat sink, wherein an effective electrical distance of the gap is at least 80 μm;

wherein a thermally conducting material is arranged between, at a first side of the thermally conducting material, the laser component, the laser driving component and the photodiode driving component, and, at a second side of the thermally conducting material, the first heat sink, wherein the thermally conducting material is arranged to absorb thermally induced mechanical movements between the first heat sink, the laser component, the laser driving component and the photodiode driving component.

2. The integrated optical transceiver according to claim 1, wherein the laser driving component and the photodiode driving component are arranged on one common flat non-conductive substrate.

3. The integrated optical transceiver according to claim 2, wherein a ground plane is attached to the common substrate, wherein the ground plane comprises at least one opening surrounding the photodiodes.

4. The integrated optical transceiver according to claim 2, wherein each individual photodiode is surrounded by its own respective opening in a ground plane, wherein the openings are separated by bridge parts of said ground plane.

5. The integrated optical transceiver according to claim 2, wherein the photodiode component is arranged with a lower height, perpendicularly to the flat substrate, than both the laser driving component and the photodiode driving component, hence forming the gap.

6. The integrated optical transceiver according to claim 2, wherein the first heat sink has a non-uniform thickness, in a direction perpendicular to the flat substrate, wherein the thickness is smaller in a vicinity of the photodiode component than in a vicinity of the laser driving component and the photodiode driving component, hence forming the gap.

7. The integrated optical transceiver according to claim 6, wherein the first heat sink comprises two discreet but connected layers, wherein a first one of said layers extends across the photodiode component, the laser driving component and the photodiode driving component, and wherein a second one of said layers, facing the photodiode component, extends across the laser driving component and the photodiode driving component but not across the photodiode component.

8. The integrated optical transceiver according to claim 1, wherein the photodiodes are Positive Intrinsic Negative (PIN) photodiodes.

9. The integrated optical transceiver according to claim 1, wherein the thermally conducting material is electrically conductive.

10. The integrated optical transceiver according to claim 1, wherein the thermally conducting material is a dielectric material, and wherein an effective electrical thickness of the thermally conducting material is at most 10 μm.

11. The integrated optical transceiver according to claim 1, wherein the thermally conducting material has a hardness of 40-70, preferably 45-60, preferably about 50, on Shore A scale.

12. The integrated optical transceiver according to claim 1, wherein the first heat sink is made of a metal material.

13. The integrated optical transceiver according to claim 1, wherein an electrical signal applied by the laser diode driving circuitry to the laser component has a frequency of at least 100 MHz.

14. An integrated optical circuit comprising the integrated optical transceiver according to claim 1.

* * * * *